(12) United States Patent
Matsuzuka et al.

(10) Patent No.: US 7,602,238 B2
(45) Date of Patent: Oct. 13, 2009

(54) POWER AMPLIFIER

(75) Inventors: Takayuki Matsuzuka, Tokyo (JP); Kazuya Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 66 days.

(21) Appl. No.: 12/098,538

(22) Filed: Apr. 7, 2008

(65) Prior Publication Data
US 2009/0174474 A1 Jul. 9, 2009

(30) Foreign Application Priority Data
Jan. 8, 2008 (JP) .............................. 2008-000976

(51) Int. Cl.
*H03F 1/14* (2006.01)
(52) U.S. Cl. ........................................ 330/51; 330/285
(58) Field of Classification Search .................. 330/51, 330/285, 296
See application file for complete search history.

(56) References Cited

U.S. PATENT DOCUMENTS

| | | | |
|---|---|---|---|
| 6,838,932 B2 * | 1/2005 | Izumiyama et al. ........... 330/51 |
| 6,882,227 B2 * | 4/2005 | Barry et al. .................. 330/296 |
| 6,946,913 B2 | 9/2005 | Moriwaki et al. | |
| 7,038,546 B2 * | 5/2006 | Kuriyama .................... 330/285 |
| 7,355,480 B2 * | 4/2008 | Honda ........................ 330/296 |
| 7,522,001 B2 * | 4/2009 | Yamamoto et al. ........... 330/285 |

FOREIGN PATENT DOCUMENTS

JP 2004-343244 5/2003

OTHER PUBLICATIONS

Yamamoto, K. et al., A CDMA InGaP/GaAs-HBT MMIC Power Amplifier Module Operating with a Low Reference Voltage of 2.4 V, *IEEE Journal of Solid-State Circuits*, 42(6):1282-1290 (2007).

* cited by examiner

*Primary Examiner*—Henry K Choe
(74) *Attorney, Agent, or Firm*—Leydig, Voit & Mayer, Ltd.

(57) ABSTRACT

An amplifier element amplifies RF signals. An emitter follower unit drives the amplifier element at a constant voltage corresponding to a reference voltage supplied to a reference terminal from outside. A current injection unit drives the amplifier element at a constant current corresponding to the reference voltage. An analog control unit analogically controls the output voltage of the emitter follower unit in correspondence with the control voltage supplied to a control terminal from outside. A mode switching unit switches whether the emitter follower unit is operated or not in correspondence with the control voltage.

11 Claims, 13 Drawing Sheets

POWER AMPLIFIER

BACKGROUND OF THE INVENTION

1. Field of the Invention

The present invention relates to a power amplifier that can analogically control the idle current of an amplifier element corresponding to a control voltage, and also can switch bias modes corresponding to the control voltage.

2. Background Art

Presently, as CDMA and other power amplifiers for mobile phones, GaAs-HBT (hetero-junction bipolar transistor) power amplifiers are widely used. FIG. 15 is a circuit diagram showing a conventional GaAs-HBT power amplifier. The circuit in the dotted-line frame is the GaAs chip, and other circuit elements are formed by chip parts and lines on a module substrate.

In FIG. 15, Tr1 and Tr2 denote GaAs-HBTs, which are a former amplifier element and a latter amplifier element, respectively. Bias1 is a former bias circuit that drives the former amplifier element, and Bias2 is a latter bias circuit that drives the latter amplifier element Vc1 and Vc2 denote collector power source terminals for the former and latter amplifier elements, respectively; Vcb denotes a power source terminal for the bias circuits Bias1 and Bias2; and Vref denotes a terminal to apply control voltage to the bias circuits Bias1 and Bias2. IN denotes an RF signal input terminal; OUT denotes an RF signal output terminal; Rb1, Rb2, Rb12 and Rb22 denote resistors; C1 to C4, C21 to C23, Cd1, Cd2 and Cdb denote capacitors; and L1 and L2 denote inductors. L11 and L21 to L23 denote lines having specific electrical lengths and function as inductors.

FIG. 16 is a circuit diagram showing a conventional power amplifier. The bias circuit for the power amplifier is the above-described latter bias circuit Bias2. However, the former bias circuit Bias1 can also be used. In FIG. 16, Vrefb denotes a terminal to which reference voltage is applied from the outside; Trb1 to Trb5 are GaAs-HBTs; and Rbb1 to Rbb6 and Rb22 denote resistors.

The emitter follower circuit including Trb1 supplies voltage corresponding to reference voltage to the input terminal of the amplifier element Tr2. The RF signal inputted from the terminal RFin are inputted to the base of the amplifier element Tr via the capacitor C4 of an input matching circuit. The amplified RF signals are outputted from the collector of the amplifier element Tr2 to the terminal RFout. The bias circuit operates so as to keep the idle current of the amplifier element constant against change in temperature (for example, refer to Japanese Patent Application Laid-Open No. 2004-343244).

SUMMARY OF THE INVENTION

In recent years, the improvement of efficiencies in low output operations (about 0 dbm) has become important in addition to that in high output operations (about 27 dbm). This is because mobile phones are mainly operated at low output in urban areas where base stations are relatively dense, and the improvement of efficiencies in low output operations is important for the talk time of mobile phones.

The present inventors therefore invented a power amplifier that analogically control the idle current of an amplifier element by control voltage applied from the outside. By changing the control voltage depending on output power to optimize the idle current, the efficiencies in low output operations can be improved.

FIG. 17 is a circuit diagram showing a power amplifier wherein the idle current of an amplifier element is analogically controlled by a control voltage supplied from the exterior. Tr1 denotes a first amplifier element, and Tr2 denotes a second amplifier element. Vc denotes a collector power source terminal of an amplifying stage, Vcb denotes a collector power source terminal of a bias circuits, Vref denotes a reference terminal to which a reference voltage (normally 2.8 to 2.9 V) is applied from the outside, and Vcon denotes a control terminal to which a control voltage is applied from the outside. Trb1 to Trb5 and Tra1 to Tra3 are GaAs-HBTs, and Rb1 to Rb6 and Ra1 to Ra6 are resistors. An input matching circuit and an output matching circuit are omitted.

RF signals inputted from the terminal RFin are inputted into the base (input terminal) of the first amplifier element Tr1 via a capacitor C1 of the input matching circuit. The first amplifier element Tr1 amplifies RF signals, and outputs them from the collector (output terminal) to the terminal RFout. The collector of the second amplifier element Tr2 (output terminal) is connected to the collector of the first amplifier element Tr1. and the both collectors are connected to the power source terminal Vc via a transmission line L. A capacitor C2 is connected between the base of the first amplifier element Tr1 and the base of the second amplifier element Tr2, and the first amplifier element Tr1 is capacitive-coupled to the base of the second amplifier element Tr2.

The emitter of Trb1 is connected to the base of Tr1 via a resistor Rb1. The base of Trb1 is connected to the reference terminal Vref via a resistor Rb2. The collector of Trb1 is connected to a power source terminal Vcb.

The collector of Trb2 is connected to the emitter of Trb1 via a resistor Rb3. The emitter of Trb2 is grounded. The base of Trb3 is connected to a reference terminal Vref via resistors Rb2 and Rb4. The collector of Trb3 is connected to a power source terminal Vcb via a resistor Rb5. The emitter of Trb3 is connected to the base of Trb2, and grounded via the resistor Rb6. The base and the collector of Trb4 are connected to the reference terminal Vref via the resistor Rb2. The base and the collector of Trb5 are connected to the emitter of the Trb4. The emitter of Trb5 is grounded.

The emitter follower circuit composed of the above-described resistors Rb3 to Rb6 and Trb1 to Trb3 supplies voltage corresponding to the reference voltage supplied to the reference terminal Vref to the base of the second amplifier element Tr2.

Between the reference terminal Vref and the base of the first amplifier element Tra1, a first resistor Ra1 and a second resistor Ra2 are connected in series. The collector of the first transistor Tra1 is connected to the reference terminal Vref via a resistor Ra3. The control voltage supplied to a control terminal Vcon is supplied to the base of the first transistor Tra1 via a resistor Ra4. Between the emitter of the first transistor Tra1 and a grounding point, a third resistor Ra5 is connected.

The base and the collector of the transistor Tra2 are connected to the collector of the first transistor Tra1 via a resistor Ra6, and the emitter thereof is grounded. The base of a transistor Tra3 is connected to the collector of the transistor Tra2, and the collector thereof is connected to the connecting point of the first resistor Ra1 and the second resistor Ra2, and the emitter thereof is grounded. These transistors Tra2 and Tra3 compose a current mirror circuit, and extract current proportional to the current inputted from the collector of the first transistor Tr1 from the connecting point of the first resistor Ra1 and the second resistor Ra2. Thereby, the current Ia2 linearly changes corresponding to the control voltage.

When the control voltage applied to the terminal Vcon is "Low" (a voltage lower than the built-in voltage Vb of the p-n junction of GaAs, e.g., 1.2 V), the first transistor Tra1 is turned OFF. Therefore, all of the current Ia3 flows in the transistor Tra2 as current Ia4. Since Tra2 and Tra3 compose a current mirror circuit, a current Ic, which is a current Ia4 multiplied by the magnifying factor of the mirror, flows in Tra3. When the circuit constant is set so that the current Ic absorbs all the current Ia1, the current Ia2 does not flow; therefore, no idle current Icq1 flows.

On the other hand, when the control voltage applied to the terminal Vcon is "High" (e.g., 2.5 V), the first transistor Tra1 is turned ON. In this case, if the circuit constant is set so that current Ia3 almost becomes current Ia5, and current Ia6 little flows, the current mirror current Ic does not flow; therefore, all the current Ia1 is supplied to the base of the first amplifier element Tr1 as current Ia2, and idle current Icq1 flows. In the present embodiment, however, the idle current Icq2 of the second amplifier element Tr2 is constant regardless of whether the control voltage is "High" or "Low".

According to the above-described configuration, idle current can be analogically controlled depending on the control voltage supplied to the control terminal Vcon. By providing the resistor Ra5, which is a high-resistance emitter load, and transistors Tra2 and Tra3, which constitute a current mirror circuit, the relationship between the control voltage and the idle current can be maintained linear as shown in FIG. 18. Therefore, the idle current can be well controlled.

In addition, by partitioning the emitter follower circuit (Rb3 to Rb6, Trb1 to Trb3) for supplying bias to the amplifier elements from the circuit for controlling the idle current of the amplifier elements ((Ra1 to Ra6, Tra1 to Tra3), stable temperature characteristics little affected by element fluctuation can be obtained.

The Trb1 of the emitter follower circuit and Trb4 of diode connection may be replaced by enhanced field effect transistors. Thereby, the reference voltage (about 2.8 to 2.9 V) can be lowered to 2.0 V or lower.

The important characteristic indices of power amplifiers for mobile phones include adjacent channel leakage power (ACLR) which is a distortion characteristic. ACLR is mainly determined by the power gain of a power amplifier and the output power characteristics of the passing phase. Therefore, by improving the flatness of the power gain and the passing phase with respect to output power, ACLR can be lowered. The flatness of the power gain and the passing phase has close relationship with the bias mode on the amplifier element.

FIG. 19 is a graph showing power gain in the constant voltage driving mode and the output power characteristics of the passing phase; and FIG. 20 is a graph showing power gain in the constant current driving mode and the output power characteristics of the passing phase. Comparing both modes described above, both power gain and passing phase show contradictory output power characteristics.

In the case of the circuit shown in FIG. 17, since the bias mode cannot be switched depending on the control voltages, only the bias circuit of the emitter follower base operates in the low output operation (low control voltage), and the bias mode approaches the constant voltage driving mode. Therefore, in the case of the power amplifier having two stages of amplifying stages to which the circuit shown in FIG. 17 was applied, in low-output operation, both initial and final stages operated in close to the constant voltage driving mode, the flatness of power gain and passing phase was deteriorated, and low-ACLR characteristics could not be obtained.

To solve the above-described problems, it is an object of the present invention to provide a power amplifier that can analogically control the idle current of an amplifier element depending on a control voltage, and can switch bias modes depending on the control voltage.

According to one aspect of the present invention, a power amplifier comprises: an amplifier element for amplifying RF signals; an emitter follower unit for the constant-voltage driving said amplifier element depending on a reference voltage supplied to a reference terminal from the exterior; a current injection unit for the constant-current driving said amplifier element depending on said reference voltage; an analog control unit for analogically controlling the output voltage of said emitter follower unit depending on a control voltage supplied to a control terminal from the exterior; and a mode switching unit for switching whether said emitter follower unit is operated or not depending on said control voltage.

According to the present invention, the idle current of an amplifier element can be analogically controlled depending on a control voltage, and bias modes can also be switched depending on the control voltage.

Other and further objects, features and advantages of the invention will appear more fully from the following description.

DETAILED DESCRIPTION OF THE PREFERRED EMBODIMENTS

First Embodiment

Figure 1:
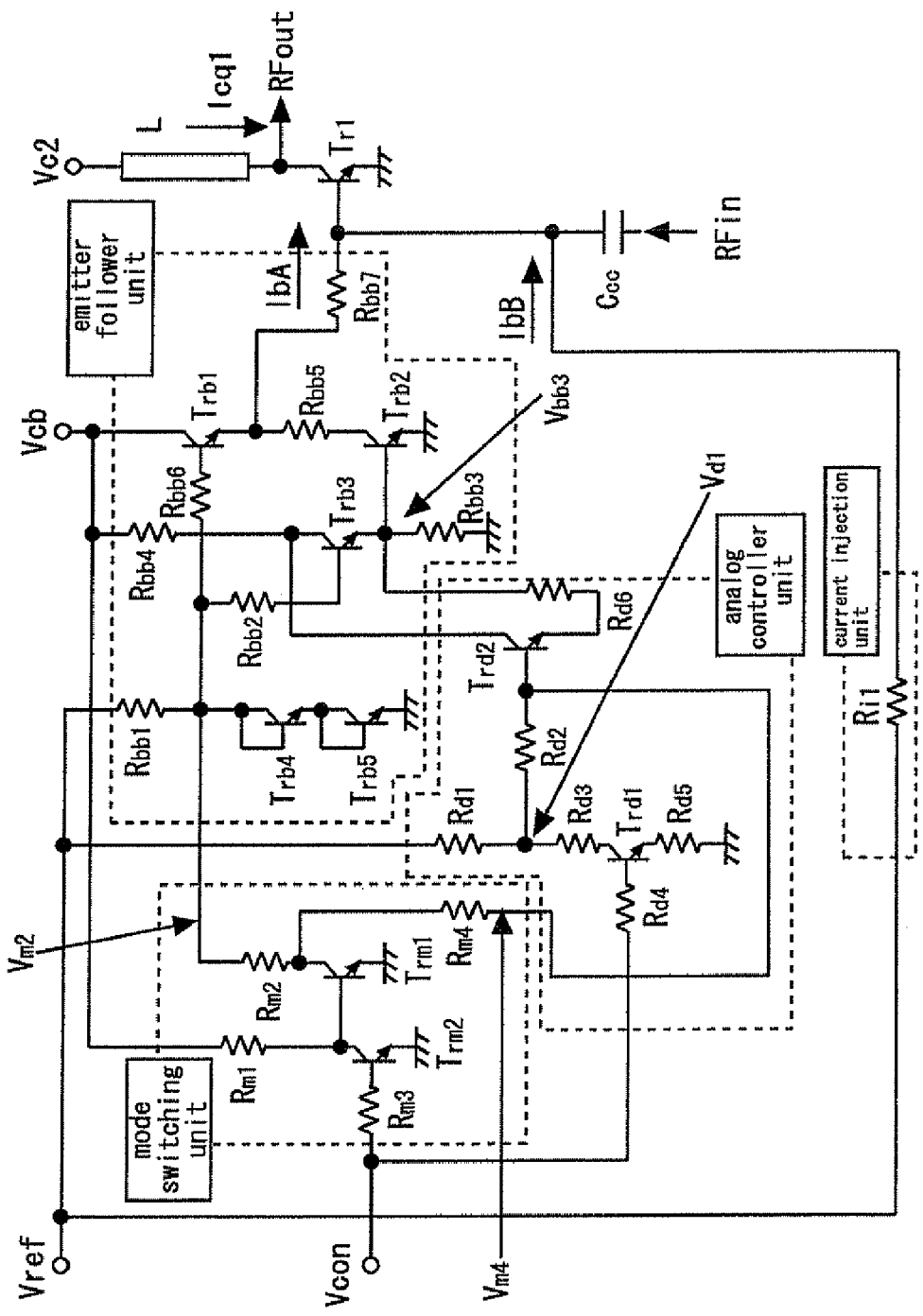
FIG. 1 is a circuit diagram showing a power amplifier according to the first embodiment of the present invention.

FIG. 1 is a circuit diagram showing a power amplifier according to the first embodiment of the present invention. The circuit is an HBT power amplifier wherein a bias circuit including an emitter follower is integrated on the same GaAs chip. In FIG. 1, an input matching circuit and an output matching circuit are omitted.

RF signals inputted from a terminal RFin are inputted into the base (input terminal) of an amplifier element Tr1 via a capacitor Ccc. The amplifier element Tr1 amplifies the RF signals, and outputs the amplified RF signals from the collector (output terminal) into a terminal RFout. The collector of the amplifier element Tr1 is connected to a collector power source terminal Vc2 via a transmission line L. The bias circuit that drives the amplifier element Tr1 has an emitter follower unit, a current injection unit, an analog controller unit, and a mode switching unit.

The emitter follower unit has transistors Trb1 to Trb5 and resistors Rbb1 to Rbb7. The base of the transistor Trb1 (first transistor) is connected to a reference terminal Vref via resistors Rbb1 and Rbb6, the collector of Trb1 is connected to the collector power source, and the emitter of Trb1 is connected to the input terminal of the amplifier element Tr1 via the resistor Rbb7. The collector of the transistor Trb2 (second transistor) is connected to the emitter of the transistor Trb1 via the resistor Rbb5, and the emitter of Trb2 is grounded. The base of the transistor Trb3 is connected to the reference terminal Vref via resistors Rbb1 and Rbb2, the collector of Trb3 is connected to the collector power source via the resistor Rbb4, and the emitter of Trb3 is grounded via the resistor Rbb3 and further is connected to the base of the transistor Trb2. The base and the collector of the transistor Trb4 are connected to the reference terminal Vref via the resistors Rbb1. The base and the collector of the transistor Trb5 (fifth transistor) are connected to the emitter of Trb4, and the emitter of Trb5 is grounded.

The current injection unit has a resistor Ri1 connected between the reference terminal Vref and the input terminal of the amplifier element Tr1.

The analog controller unit has transistors Trd1 and Trd2, and resistors Rd1 to Rd6. The base of the transistor Trd1 (third transistor) is connected to the control terminal Vcon via the resistor Rd4, the collector of Trd1 is connected to the reference terminal Vref via the resistor Rd1 (first resistor) the resistor Rd3, and the emitter of Trd1 is grounded via the resistor Rd5. The base of the transistor Trd2 (fourth transistor) is connected to the reference terminal Vref via the resistors Rd1 and Rd2, the collector of Trd2 is connected to the collector power source via the resistor Rbb4, and the emitter of Trd 2 is connected to the base of the transistor Trb2 via the resistor Rd6.

The mode switching unit has transistors Trm1 and Trm2, and resistors Rm1, Rm2 and Rm3. The collector of the transistor Trm1 (switch) is connected to the resistor Rbb1 of the input of the emitter follower unit via the resistor Rm2, and further connected to the base of the transistor Trd2 of the analog controller unit via the resistor Rm4, and the emitter of Trm1 is grounded. The base of the transistor Trm2 is connected to the control terminal Vcon via the resistor Rm3, the collector of Trm2 is connected to the collector power source terminal Vcb via the resistor Rm1, and further connected to the base of the transistor Trm1, and the emitter of Trm2 is grounded. The transistor Trm2, and the resistors Rm1 and Rm3 compose an inverter circuit.

The operation of the above-described circuit will be described. The emitter follower unit drives the amplifier element Tr1 at a constant voltage corresponding to a reference voltage (normally 2.8 to 2.9 V) supplied to a reference terminal Vref from the exterior. On the other hand, the current injection unit drives the amplifier element Tr1 at a constant current corresponding to the reference voltage.

Next, the operation of the analog control unit will be described. When the control voltage of a "High" level (e.g., 2.5 V) is supplied to the terminal Vcon, since the transistor Trd1 is turned ON, a collector current flows via the resistor Rd3, voltage Vd1 is lowered due to voltage drop in the resistor Rd1, and the transistor Trd2 is turned OFF. In this case, therefore, the analog control unit does not affect the operation of the emitter follower unit.

On the other hand, when the control voltage is in a "Low" level (e.g., 0 V), since the transistor Trd1 is turned OFF, the reference voltage is supplied to the base terminal of the transistor Trd2 via resistors Rd1 and Rd2, and a collector current flows in the transistor Trd2. Since voltage Vbb3 is elevated, the collector current of the transistor Trb2 in the emitter follower unit is increased, and the emitter potential of the transistor Trb1 is lowered by this collector current, the idle current Icq1 of the amplifier element Tr1 is decreased.

Since the collector current of the transistor Trd1 can be continuously varied when the resistance value of the resistor Rd5 is adequately set, the control voltage can be continuously varied from the "Low" level state (idle current is small) to the "High" level state (idle current is large). Thereby, the analog control unit analogically controls the output voltage of the emitter follower unit depending on the control voltage supplied into the control terminal Vcon from the exterior.

Next, the operation of the mode switching unit will be described. When the control voltage is in a "High" level, since the transistor Trm1 is turned OFF, the operation of the emitter follower unit and the analog control unit is not affected. On the other hand, when the control voltage is in a "Low" level, since the transistor Trm1 is turned ON, current is extracted from the emitter follower unit and the analog control unit through resistors Rm2 and Rm4. By this current, voltages Vm2 and Vm4 are lowered, and each base voltage is lowered to turn OFF transistors Trb1, Trb3 and Trd2; therefore, the emitter follower unit does not operate. The transistor Trm1 of the mode switching unit switches whether current inputted from the reference terminal Vref into the emitter follower unit via the resistor Rbb1 is extracted or not. Thereby, the mode switching unit switches whether the emitter follower unit is operated or not depending on the control voltage. The control voltage at which these modes are switched is about 1.25 to 1.30 V, where the transistor Trm2 is switched ON or OFF.

As described above, the power amplifier according to the present invention can analogically control the idle current Icq1 of the amplifier element Tr1 depending on the control voltage using the analog control unit. Furthermore, the bias mode can be switched depending on the control voltage using the mode switching unit.

Figure 2:
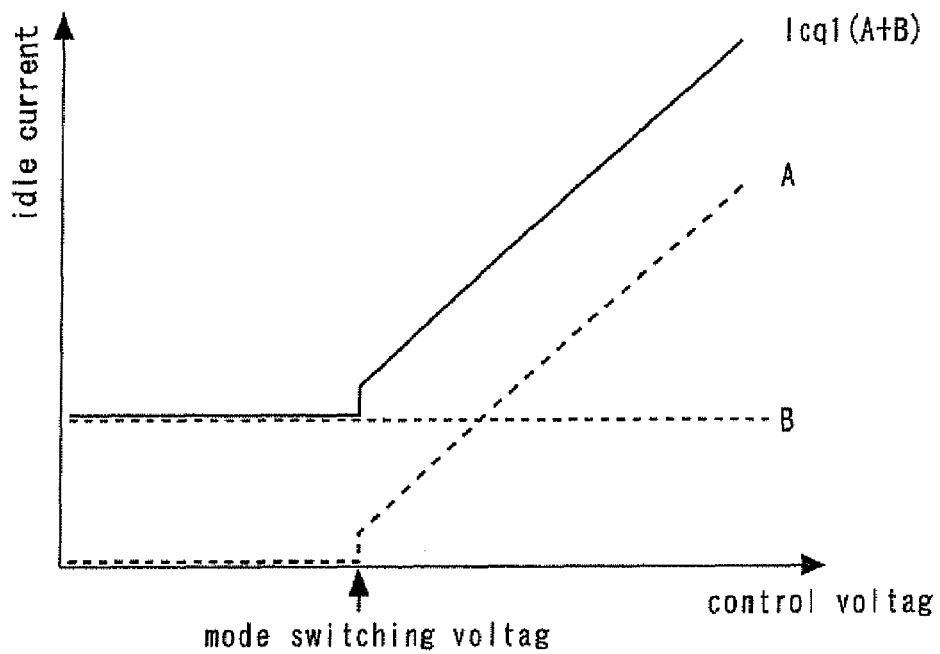
FIG. 2 is a graph showing the relationship between control voltage and idle current of the power amplifier according to the first embodiment.

FIG. 2 is a graph showing the relationship between control voltage and idle current of the power amplifier according to the first embodiment. The idle current characteristics by the emitter follower unit are as indicated by the broken line A. On the other hand, the idle current characteristics by the current injection unit become independent of the control voltage as indicated by the broken line B. Therefore, when the power amplifier according to the first embodiment is used, since the idle current of the amplifier element is the sum of these, the idle current characteristics are as indicated by the solid line Icq1 (A+B). In the low output operation (low control voltage), only the current injection unit operates as the idle current characteristics B, and the amplifier element is in the operation state close to the constant-current driving mode.

Figure 17:
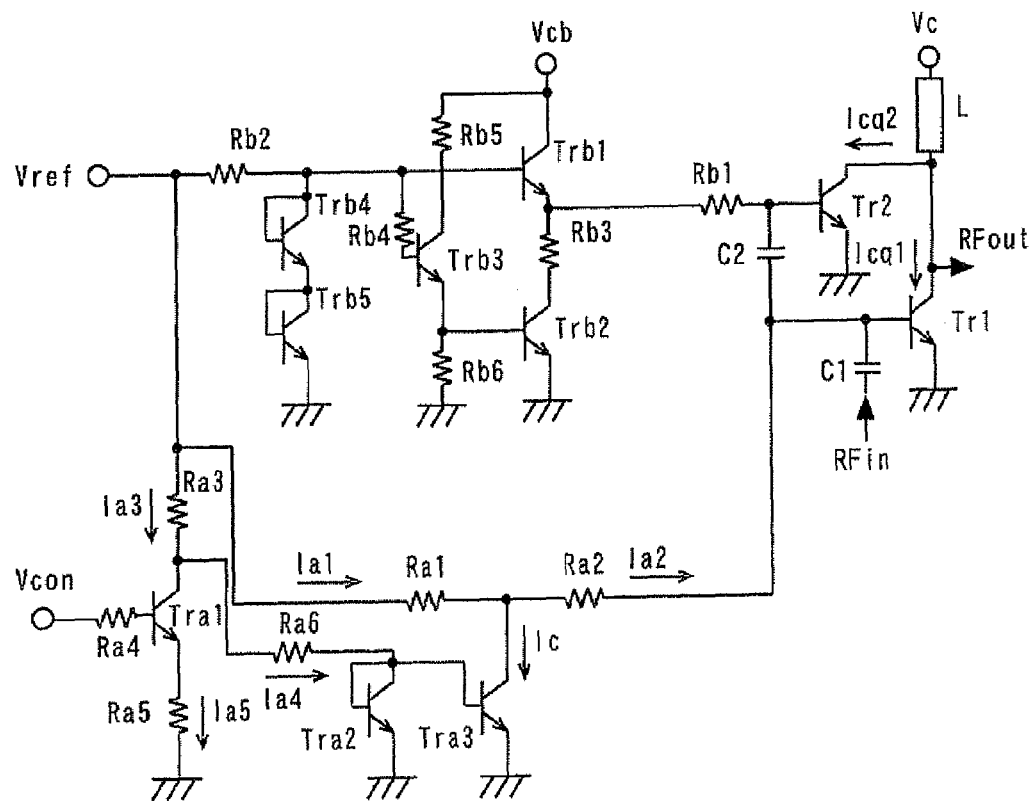
FIG. 17 is a circuit diagram showing a power amplifier wherein the idle current of an amplifier element is analogically controlled by a control voltage supplied from the exterior.
Figure 18:
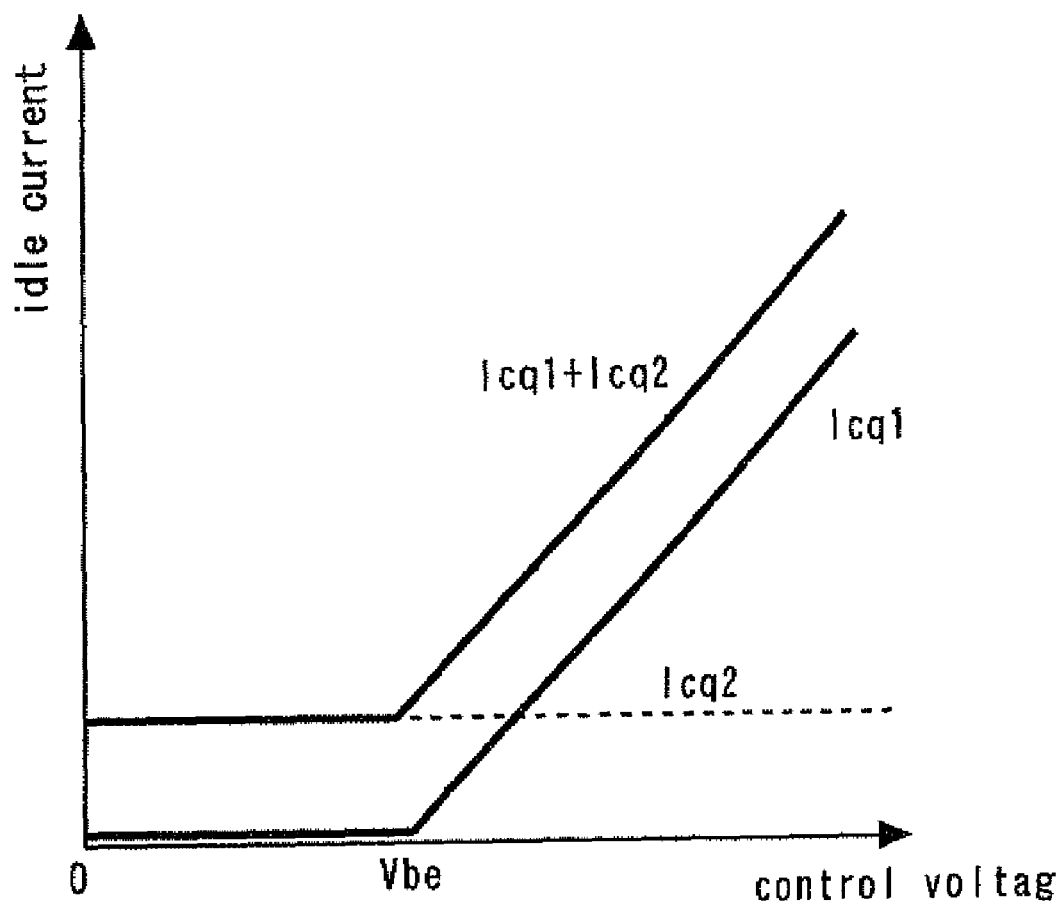
FIG. 18 shows the relationship between the control voltage and the idle current of the power amplifier of FIG. 17.
Figure 19:
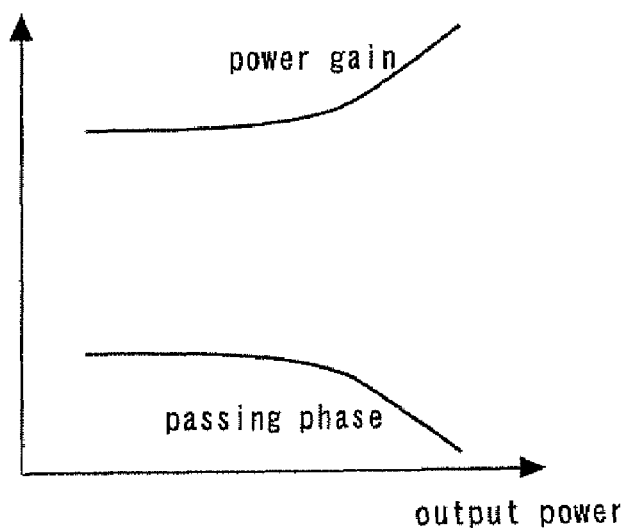
FIG. 19 is a graph showing power gain in the constant voltage driving mode and the output power characteristics of the passing phase.
Figure 20:
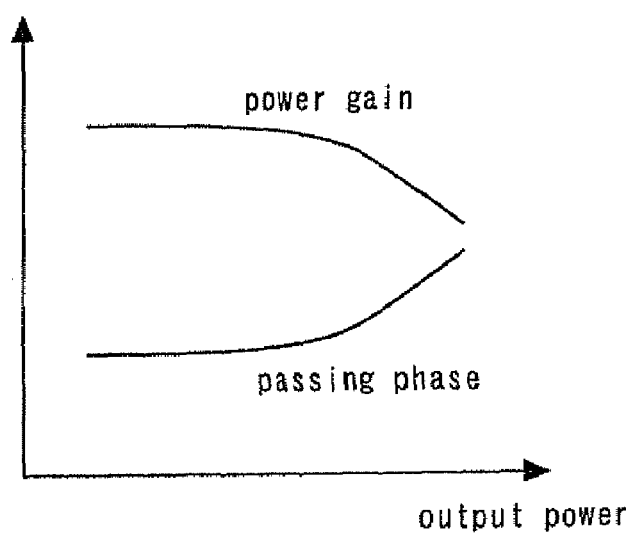
FIG. 20 is a graph showing power gain in the constant current driving mode and the output power characteristics of the passing phase.

As described above, the power amplifier according to the first embodiment operates the amplifier element in the constant-current driving mode at the time of low output (low control voltage) operation, and operates the amplifier element mainly in the constant-voltage driving mode at the time of high output (high control voltage) operation. Therefore, since the power gain and the output power characteristics of the passing phase mutually counteract in the initial and final stages at the time of low output operation, and flatness is improved by using the power amplifier according to the first embodiment in a stage of the two-stage amplifier, and using the power amplifier shown in FIG. 17 in the other, low ACLR characteristics can be realized.

Second Embodiment

Figure 3:
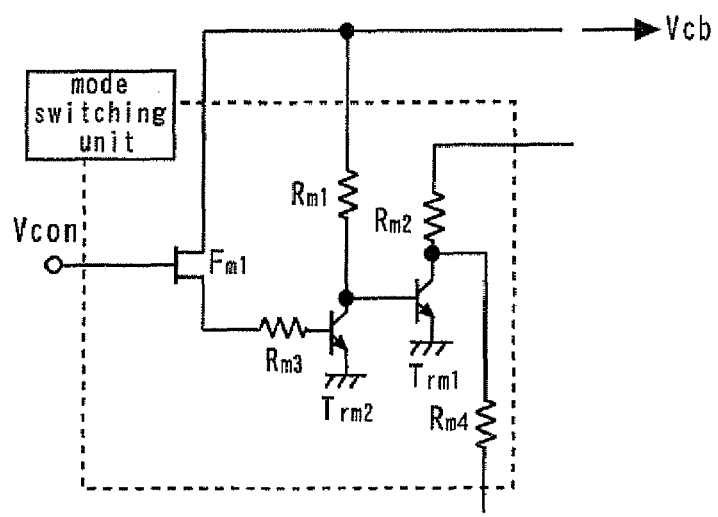
FIG. 3 is a circuit diagram showing the mode switching unit of a power amplifier according to the second embodiment.

FIG. 3 is a circuit diagram showing the mode switching unit of a power amplifier according to the second embodiment. The configuration other than the mode switching unit is the same as the configuration of the first embodiment.

A field effect transistor Fm1 is further added to the configuration of the mode switching unit of the first embodiment. The gate (input terminal) of the field effect transistor Fm1 is connected to a control terminal Vcon, the drain of Fm1 is connected to a collector power source terminal Vcb, and the source (output terminal) of Fm1 is connected to the base of Trm2.

Figure 4:
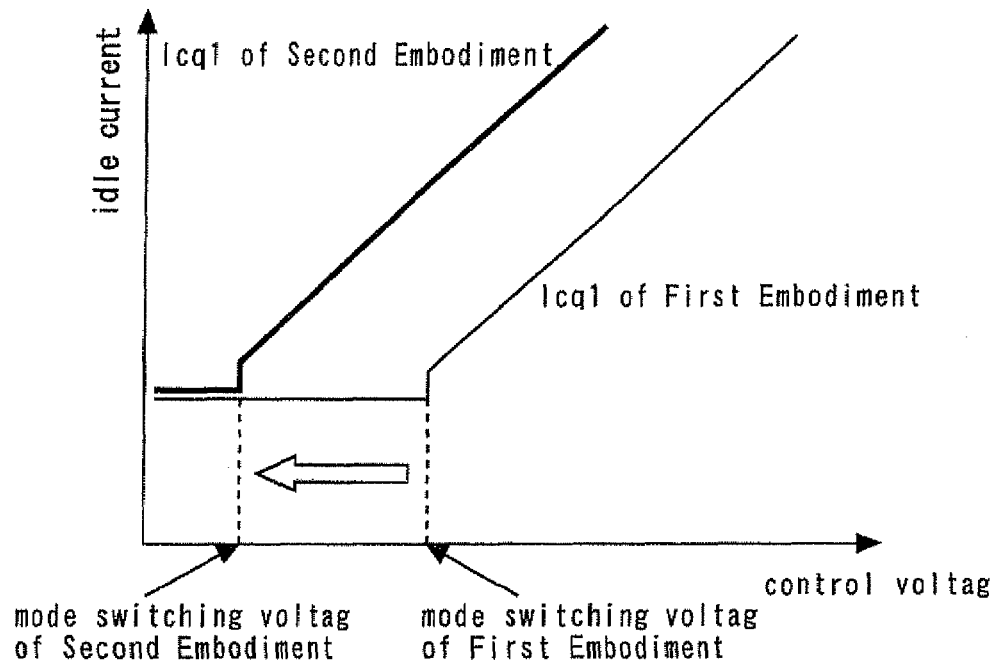
FIG. 4 is a graph showing the relationship between control voltage and idle current of the power amplifier according to the second embodiment.

FIG. 4 is a graph showing the relationship between control voltage and idle current of the power amplifier according to the second embodiment. As shown in FIG. 4, the mode switching voltage can be shifted to the low-voltage side by the gate-source voltage of Fm1 in comparison with the first embodiment. (The gate has a negative voltage relative to the voltage of the source).

Third Embodiment

Figure 5:
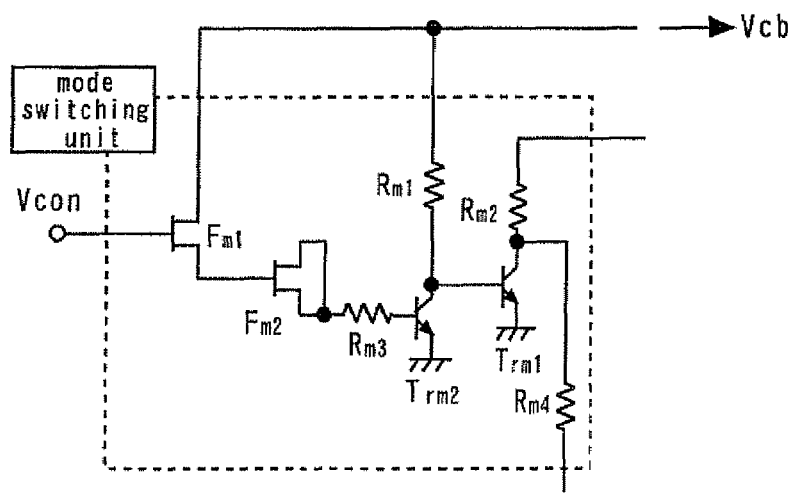
FIG. 5 is a circuit diagram showing the mode switching unit of a power amplifier according to the third embodiment.

FIG. 5 is a circuit diagram showing the mode switching unit of a power amplifier according to the third embodiment. The configuration other than the mode switching unit is the same as the configuration of the first embodiment.

A field effect transistor Fm2 is further added to the configuration of the mode switching unit of the second embodiment. The field effect transistor Fm2 is connected between the source of the field effect transistor Fm1 and the resistor Rm3. By short-circuiting the source and the drain, the field effect transistor Fm2 functions as a schottky barrier diode.

Figure 6:
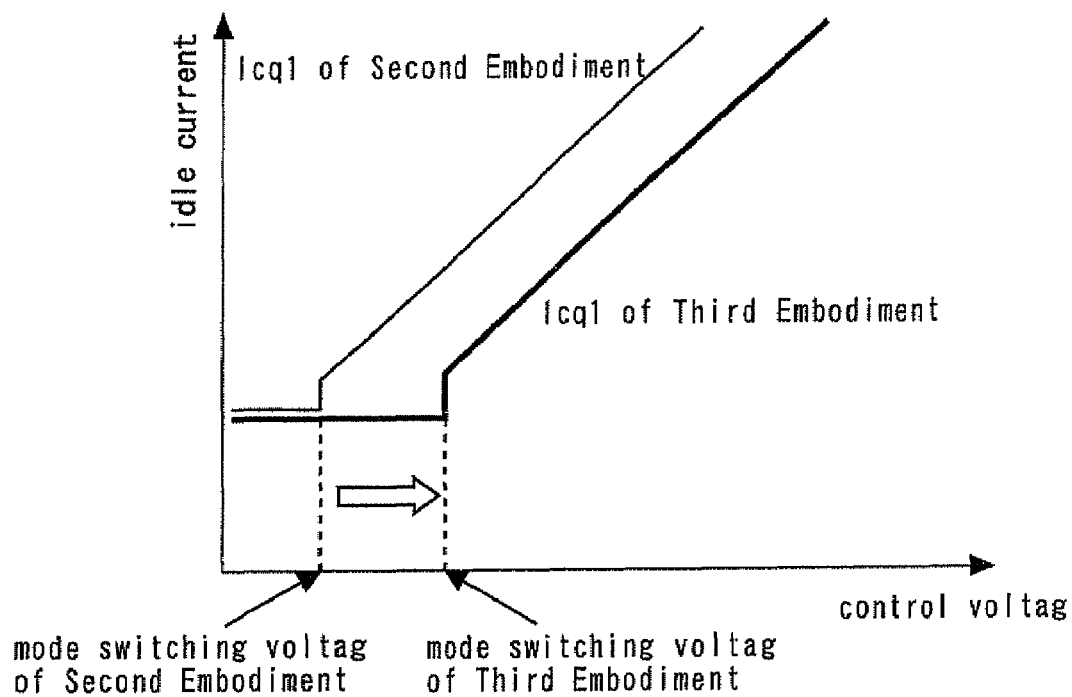
FIG. 6 is a graph showing the relationship between control voltage and idle current of the power amplifier according to the third embodiment.

FIG. 6 is a graph showing the relationship between control voltage and idle current of the power amplifier according to the third embodiment. As shown in FIG. 6, the mode switching voltage can be shifted to the high-voltage side by the ON voltage of the schottky barrier diode (about 0.7 V) in comparison with the second embodiment.

Fourth Embodiment

Figure 7:
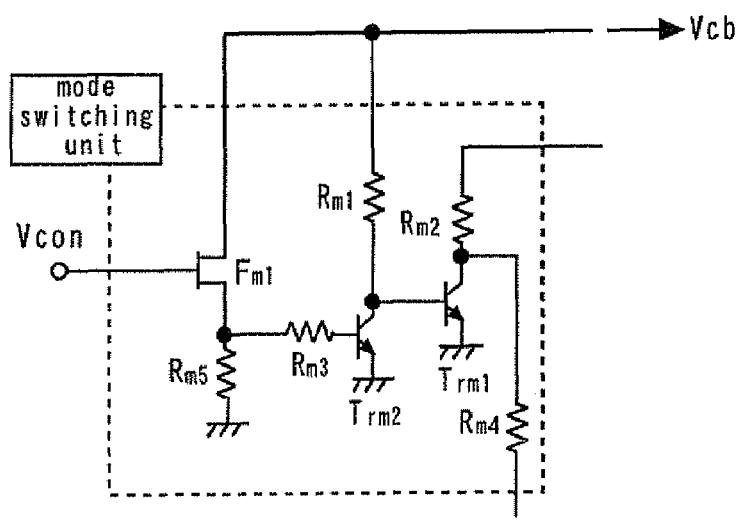
FIG. 7 is a circuit diagram showing the mode switching unit of a power amplifier according to the fourth embodiment.

FIG. 7 is a circuit diagram showing the mode switching unit of a power amplifier according to the fourth embodiment. The configuration other than the mode switching unit is the same as the configuration of the first embodiment.

A resistor Rm5 (second resistor) is further added to the configuration of the mode switching unit of the second embodiment. The resistor Rm5 is a shunt resistor connected between the source of the field effect transistor Fm1 and the grounding point.

Figure 8:
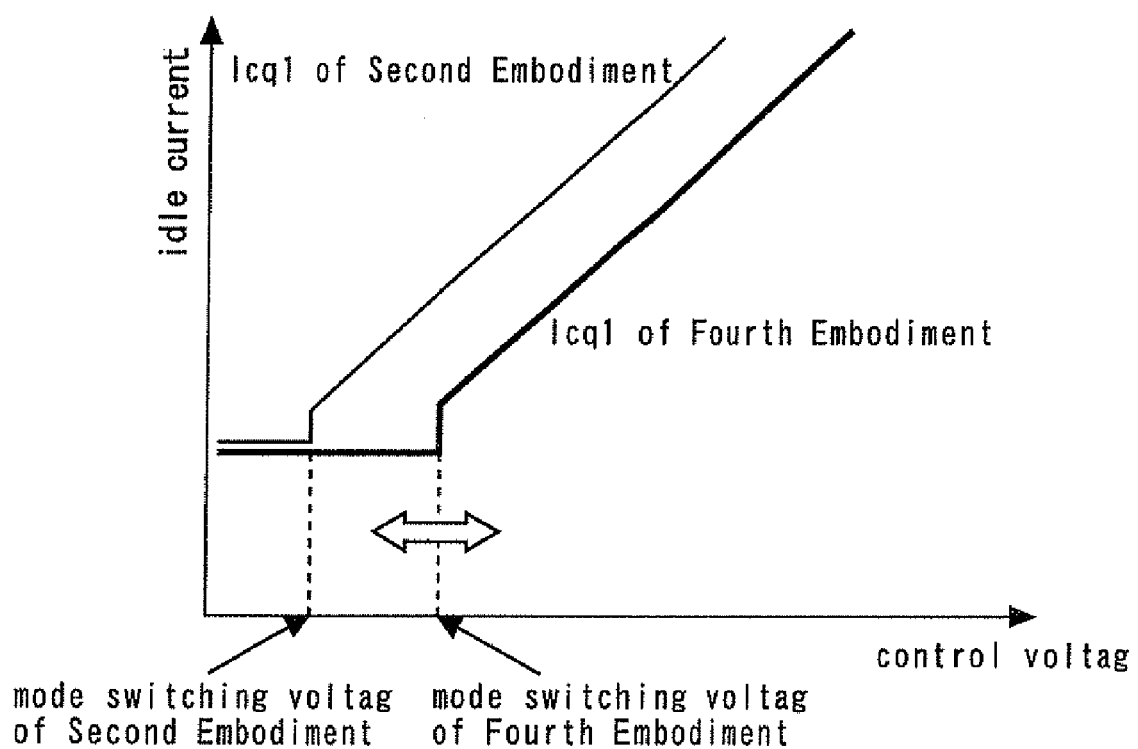
FIG. 8 is a graph showing the relationship between control voltage and idle current of the power amplifier according to the fourth embodiment.

FIG. 8 is a graph showing the relationship between control voltage and idle current of the power amplifier according to the fourth embodiment. As shown in FIG. 8, the mode switching voltage is shifted to the high-voltage side depending on the resistance value of the resistor Rm5. This is because the source voltage of the field effect transistor Fm1 is lowered by the flowing of a current depending on the resistance value of the resistor Rm5. Therefore, by adequately setting the resistance value of the resistor Rm5, the mode switching voltage can be set to an optional value within a range equal to or higher than the value of the mode switching voltage of the second embodiment.

Fifth Embodiment

Figure 9:
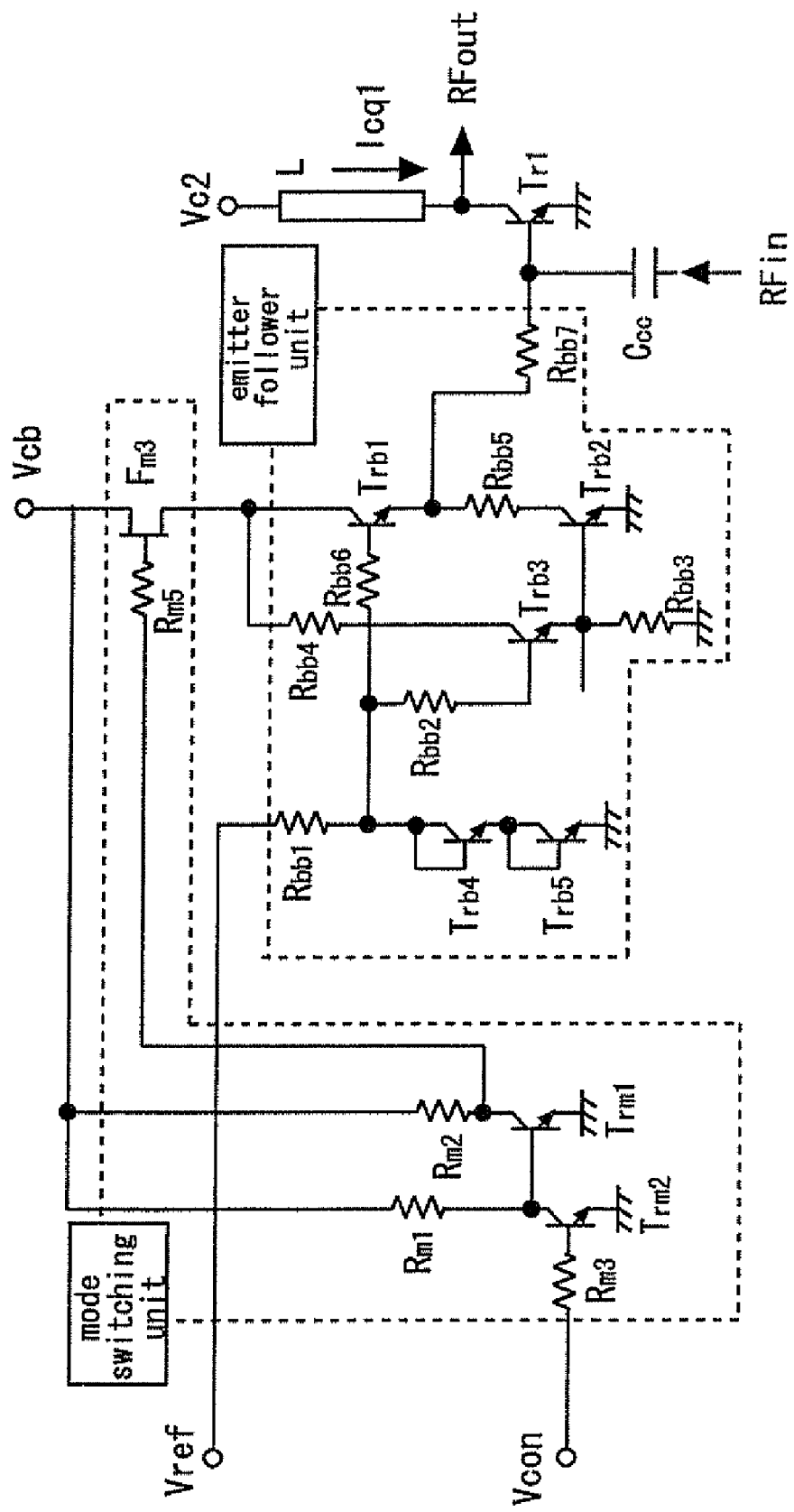
FIG. 9 is a circuit diagram showing the emitter follower unit and the mode switching unit of a power amplifier according to the fourth embodiment.

FIG. 9 is a circuit diagram showing the emitter follower unit and the mode switching unit of a power amplifier according to the fourth embodiment. The analog control unit and the current injection unit are omitted because they are identical to the analog control unit and the current injection unit in the first embodiment.

The mode switching unit has resistors Rm1, Rm2, Rm3, Rm5, transistors Trm1, Trm2, and a field effect transistor Fm3 (switch). The collector of the transistor Trm1 is connected to a collector power source terminal Vcb via the resistor Rm2, and the emitter of Trm1 is grounded. The base of the transistor Trm2 is connected to a control terminal Vcon via the resistor Rm3, the collector of Trm2 is connected to the collector power source terminal Vcb via the resistor Rm1, and the emitter of Trm2 is grounded. The source of the field effect transistor Fm3 is connected to the collector of the transistor Trb1 in the emitter follower unit, the drain of Fm3 is connected to the collector power source terminal Vcb, and the gate of Fm3 is connected to the collector of the transistor Trm1 via the resistor Rm5.

A voltage corresponding to the control voltage is supplied to the gate of the field effect transistor Fm3 via the transistors Trm1 and Trm2. Therefore, the field effect transistor Fm3 switches whether the collector voltage is supplied to the emitter follower unit depending to the control voltage or not.

In the first embodiment, current is extracted from the reference terminal Vref via the resistor Rm2 for turning OFF the emitter follower unit at the time of low-output (low control voltage) operation. While in the fifth embodiment, the field effect transistor Fm3 is operated as a switch to turn the collector power source of the emitter follower unit ON and OFF without flowing excessive current. Therefore, compared with the first embodiment, the consumption of the current supplied from the reference terminal Vref can be reduced at the time of low control voltage.

Sixth Embodiment

Figure 10:
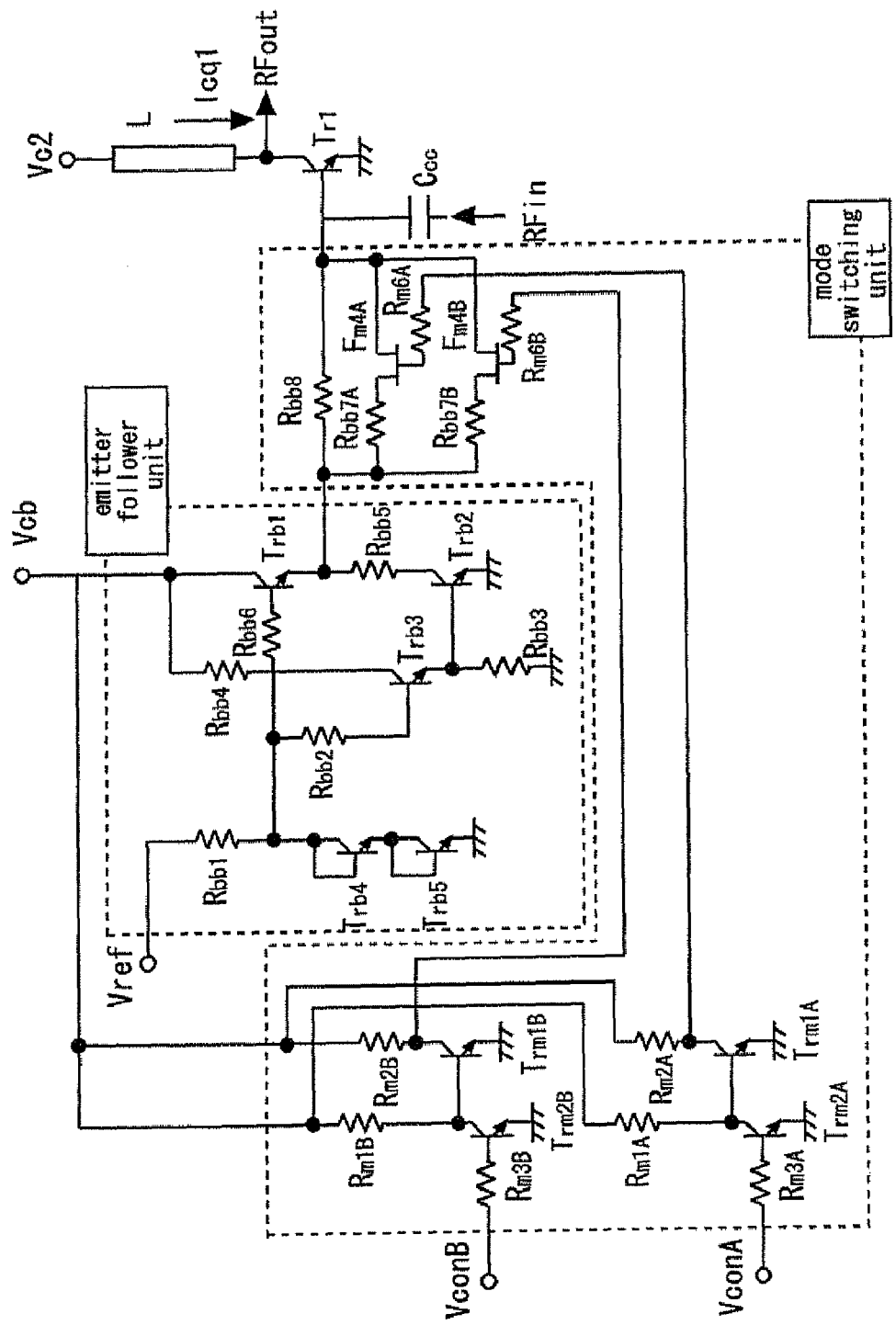
FIG. 10 is a circuit diagram showing the emitter follower unit and the mode switching unit of a power amplifier according to the sixth embodiment.

FIG. 10 is a circuit diagram showing the emitter follower unit and the mode switching unit of a power amplifier according to the sixth embodiment. The analog control unit and the current injection unit are identical to the analog control unit and the current injection unit in the first embodiment and are omitted to show in the Figure.

The mode switching unit has transistors Trm1A, TrmA, Trm1B and TrmB, resistors Rm1A, Rm1B, Rm2A, Rm2B, Rm3A, Rm3B, Rbb7A, Rbb7B, Rbb8, Rm6A and Rm6B, field effect transistors Fm4A and Fm4B, and control voltage terminals VconA and VconB to which control voltage is individually supplied.

The collector of the transistor Trm1A is connected to the collector power source terminal Vcb via the resistor Rm2A, and the emitter of Rm2A is grounded. The base of the transistor Trm2A is connected to the control terminal VconA via the resistor Rm3A, the collector of Trm2A is connected to the collector power source terminal Vcb via the resistor Rm1A, and the emitter of Trm2A is grounded. On the other hand, the collector of the transistor Trm1B is connected to the collector power source terminal Vcb via the resistor Rm2B, and the emitter of Trm1B is grounded. The base of the transistor Trm2B is connected to the control terminal VconB via the resistor Rm3B, the collector of Trm2B is connected to the collector power source terminal Vcb via the resistor Rm1B, and the emitter of Trm2B is grounded.

The resistor Rbb8 (third resistor) is connected between the output terminal of the emitter follower unit and the base (input terminal) of the amplifier element Tr1. The resistors Rbb7A and Rbb7B (fourth resistors) are connected to the resistor Rbb8 in parallel. The resistance values of the resistors Rbb7A and Rbb7B are set to about the same as the resistance value of the resistor Rbb7 in the first embodiment; and the resistance value of the resistor Rbb8 is set to sufficiently higher than the resistance value of the resistor Rbb7. The field effect transistors Fm4A and Fm4B (switches) are connected to the resistors Rbb7A and Rbb7B in series. The gates of the field effect transistors Fm4A and Fm4B are connected to the collectors of the transistors Trm1A and Trm1B via the resistors Rm6A and Rm6B, respectively.

The field effect transistors Fm4A and Fm4B switch whether the corresponding resistors Rm6A and Rm6B are connected to the resistor Rbb8 depending on the control voltage supplied to the corresponding control terminals VconA and VconB or not.

For example, when the "High" level is supplied to the terminal VconA and the "Low" level (e.g., grounding) is supplied to VconB, the resistance value of the output side of the emitter follower unit (corresponding to the resistor Rbb7 of the circuit in the first embodiment) becomes the resistance value of the resistor Rbb7A. On the other hand, when the "Low" level is supplied to both terminals VconA and VconB, the resistance value of the output side of the emitter follower unit becomes the resistance value of the resistor Rbb8. In this case, if the resistance value of the resistor Rbb8 is sufficiently high, the emitter follower unit cannot drive the amplifier element. The mode switching unit can thus switch whether to operate the emitter follower unit depending on the control voltage supplied to the terminals VconA and VconB or not.

By setting the resistance values of the resistors Rbb7A and Rbb7B to different values, and by separately using the control voltage terminals depending on the specifications, the idle current of the amplifier element Tr1 can also be switched selectively.

Although the case wherein two current settings are feasible has been shown in the sixth embodiment, three or more current settings can also be realized in the same chip by adding a similar circuit.

Seventh Embodiment

Figure 11:
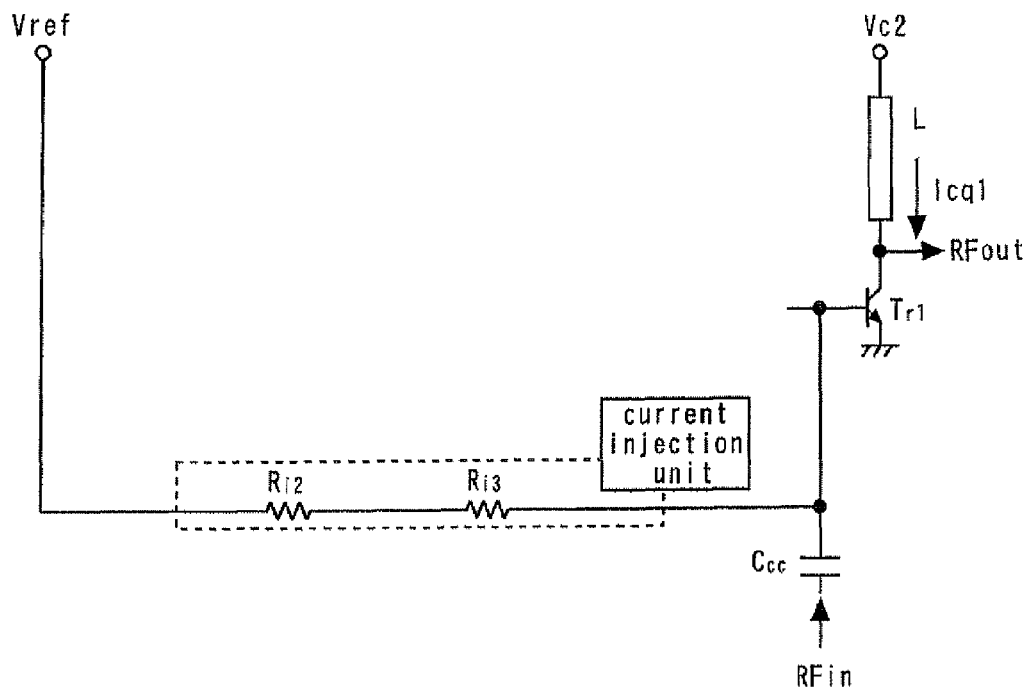
FIG. 11 is a circuit diagram showing the current injection unit of a power amplifier according to the seventh embodiment.

FIG. 11 is a circuit diagram showing the current injection unit of a power amplifier according to the seventh embodiment. The configuration other than the current injection unit is the same as the configuration of the first to sixth embodiments.

The current injection unit has resistors Ri2 (fifth resistor) and Ri3 (sixth resistor) connected in series between the reference terminal Vref and the input terminal of the amplifier element Tr1. The resistor Ri2 is a resistor composed of a semiconductor layer (e.g., base layer), and the resistor Ri3 is a resistor composed of a thin-film metal (e.g., NiCr layer).

Although the resistor Ri2 composed of a semiconductor layer has a positive temperature coefficient, the resistance value of the resistor Ri3 composed of a thin-film metal does not depend on temperature. Therefore, by combining these resistors, the temperature characteristics of the idle current can be optimized, and the idle current in low-power operation (low control voltage) can be reduced.

Eighth Embodiment

Figure 12:
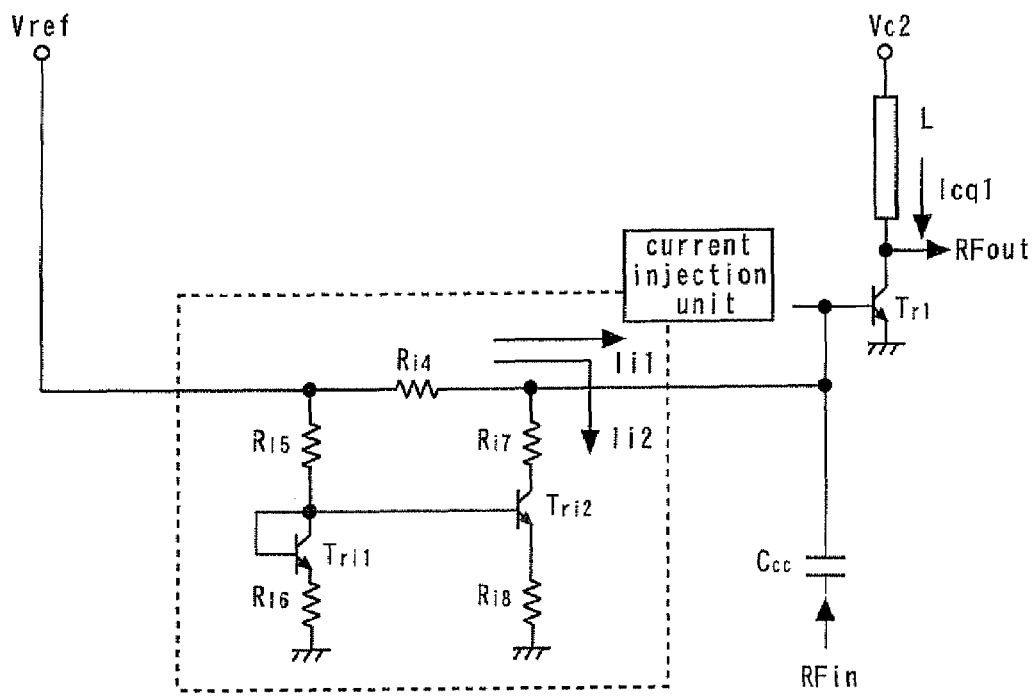
FIG. 12 is a circuit diagram showing the current injection unit of a power amplifier according to the eighth embodiment.

FIG. 12 is a circuit diagram showing the current injection unit of a power amplifier according to the eighth embodiment. The configuration other than the current injection unit is the same as the configuration of the first to sixth embodiments.

The current injection unit has a resistor Ri4 (fifth resistor), resistors Ri5 to Ri8 (sixth resistors), and transistors Tri1 and Tri2 connected between the reference terminal Vref and the input terminal of the amplifier element Tr1. The transistor Tri1 functions as a diode whose anode is connected to a reference terminal Vref via the resistor Ri5 and whose cathode is grounded via the resistor Ri6. The transistor Tri2 functions as a diode whose anode is connected to a reference terminal Vref via the resistors Ri4 and Ri7 and whose cathode is grounded via the resistor Ri8.

From the reference terminal Vref, current Ii2 flows via the resistor Ri7 in addition to current Ii1 injected into the base of the amplifier element Tr1. The current Ii2 causes voltage drop in the resistor Ri4 to lower the base voltage of the amplifier element Tr1. Therefore, by adequately setting the temperature characteristics of the current Ii2, the idle current Icq1 of the amplifier element Tr1 can be set to desired temperature characteristics. Compared with the seventh embodiment, the controllability of temperature characteristics is better. Since the resistance value corresponding to the resistors Ri2 and Ri3 can be lowered, the chip size can be reduced.

Ninth Embodiment

Figure 13:
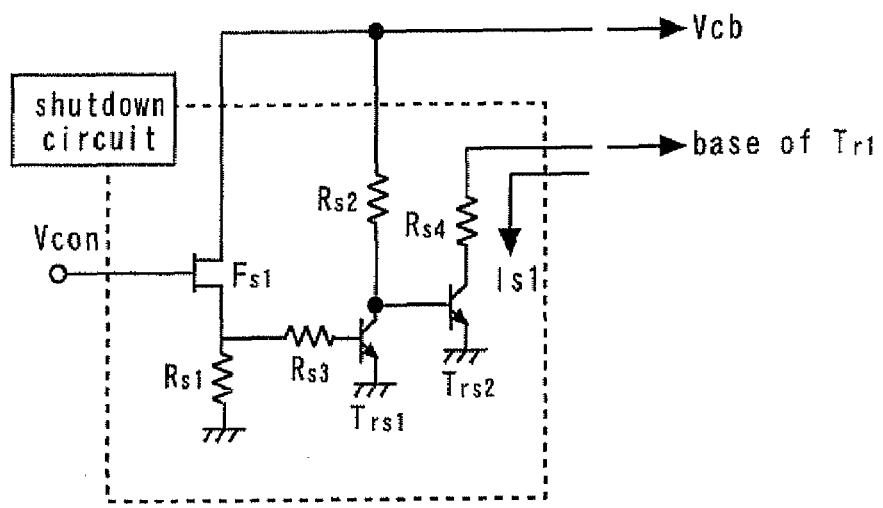
FIG. 13 is a circuit diagram showing the shutdown circuit unit of a power amplifier according to the ninth embodiment.

FIG. 13 is a circuit diagram showing the shutdown circuit unit of a power amplifier according to the ninth embodiment. The power amplifier according to the ninth embodiment further has the shutdown circuit shown in FIG. 13 in addition to the configuration of the first to eighth embodiments.

The shutdown circuit has a field effect transistor Fs1, resistors Rs1 to Rs4, and transistors Trs1 and Trs2. The gate of the field effect transistor Fs1 is connected to a control voltage terminal Vcon, the drain of Fs1 is connected to a collector power source terminal, and the source of Fs1 is grounded via the resistor Rs1. The base of the transistor Trs1 is connected to the source of Fs1 via the resistor Rs3, the collector of Trs1 is connected to the collector power source terminal Vcb via the resistor Rs2, and the emitter of Trs1 is grounded. The base of the transistor Trs2 is connected to the collector of Trs1, the collector of Trs2 is connected to the base of the amplifier element Tr1 via the resistor Rs4, and the emitter of Trs2 is grounded.

Figure 14:
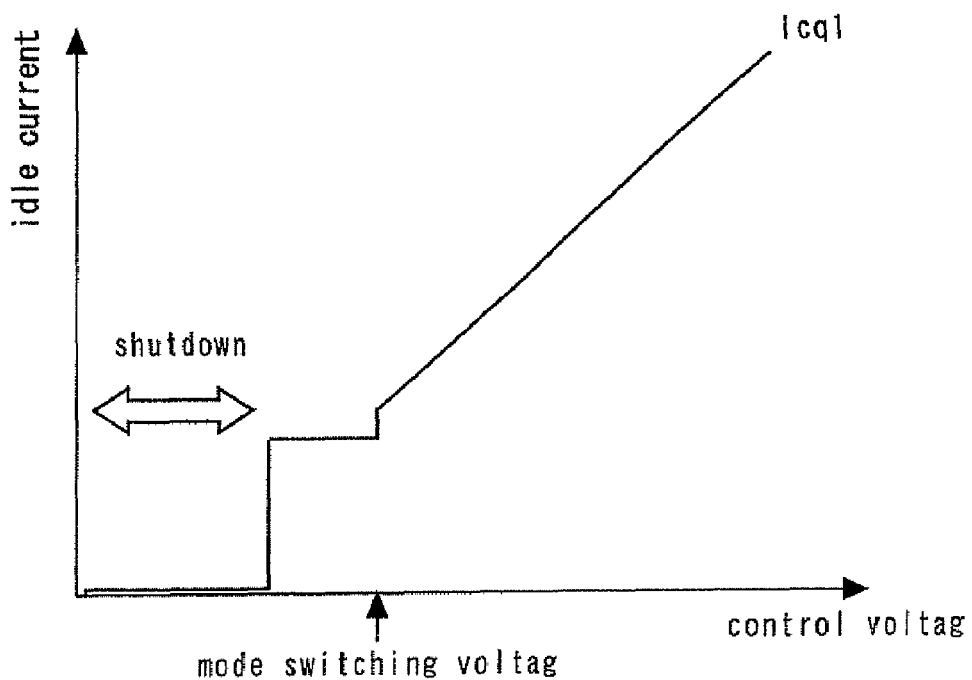
FIG. 14 is a graph showing the relationship between the control voltage of the power amplifier according to the ninth embodiment and the idle current.
Figure 15:
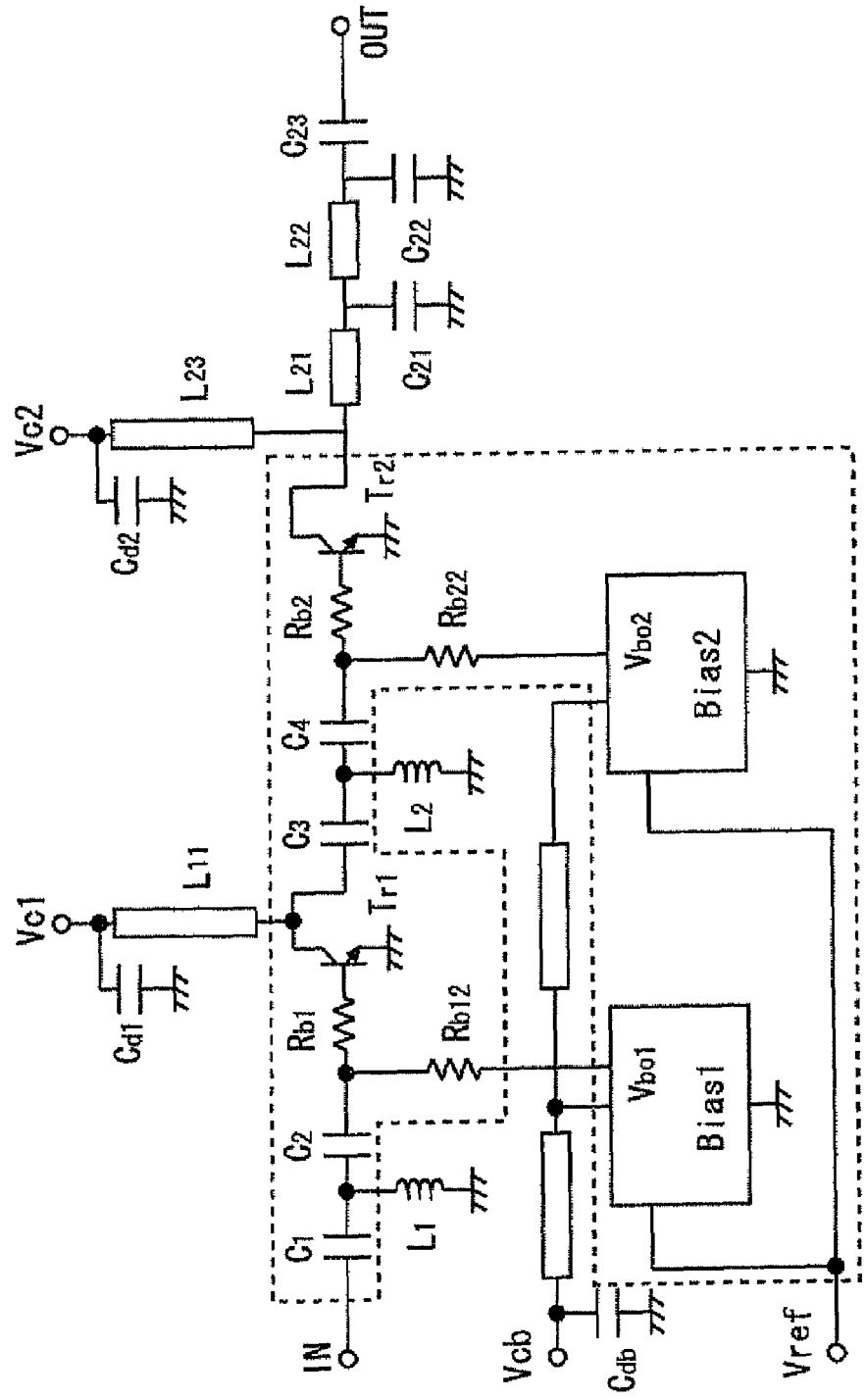
FIG. 15 is a circuit diagram showing a conventional GaAs-HBT power amplifier.
Figure 16:
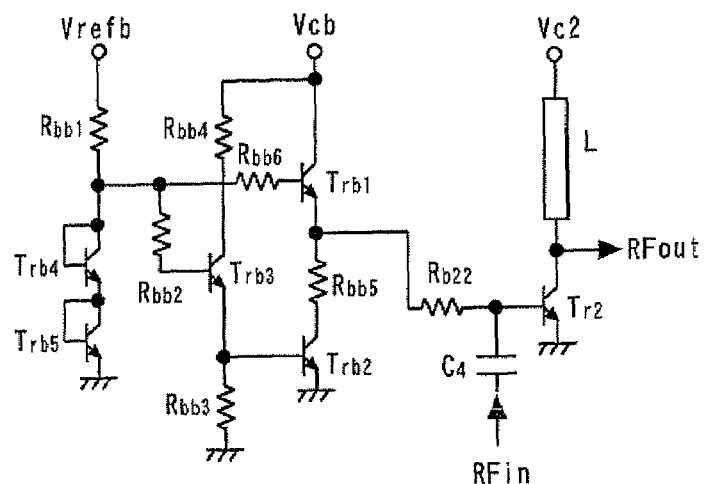
FIG. 16 is a circuit diagram showing a conventional power amplifier.

FIG. 14 is a graph showing the relationship between the control voltage of the power amplifier according to the ninth embodiment and the idle current. When the control voltage is in "High" level, since the transistor Trs2 is turned OFF, the operation of the amplifier element Tr1 is not affected. On the other hand, when the control voltage is in "Low" level, since the transistor Trs2 is turned ON, current Is1 is extracted from the base of the amplifier element Tr1 via the resistor Rs4, and the base voltage of the amplifier element Tr1 is lowered; therefore, the amplifier element Tr1 is shut down. Thus, the shutdown circuit shuts down the amplifier element Tr1 depending on the control voltage.

For example, in the case of a power amplifier having a path to bypass the amplifier element Tr1, the signal path is switched depending on the control voltage supplied from the exterior. When RF signals pass the bypass path, since the amplifier element Tr1 must be shut down, the ninth embodiment can be favorably applied.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-000976, filed on Jan. 8, 2008 including specification, claims, drawings and summary, on which the Convention priority of the present application is based, are incorporated herein by reference in its entirety.

What is claimed is:

1. A power amplifier comprising:
an amplifier element for amplifying RF signals input to an input terminal of said amplifier element;
an emitter follower unit having an output terminal and for constant-voltage driving of said amplifier element, depending on a reference voltage applied to a reference terminal from outside the power amplifier;
a current injection unit for constant-current driving of said amplifier element, depending on the reference voltage;
an analog control unit for analogically controlling output voltage of said emitter follower unit, depending on a control voltage applied to a control terminal from outside the power amplifier; and
a mode switching unit for switching said emitter follower unit to operate or not, depending on the control voltage.

2. The power amplifier according to claim 1, wherein:
said emitter follower unit includes
a first transistor having a base connected to the reference terminal, a collector connected to a collector power source, and an emitter connected to the input terminal of said amplifier element, and
a second transistor having a collector connected to the emitter of said first transistor, and an emitter that is grounded;
said analog control unit includes a first resistor and a third transistor having a base connected to the control terminal, a collector connected to the reference terminal via said resistor, and an emitter that is grounded, and
a fourth transistor having a base connected to the reference terminal via said first resistor, a collector connected to the collector power source, and an emitter connected to the base of said second transistor.

3. The power amplifier according to claim 1, wherein said mode switching unit includes a switch having an input terminal and switching whether current inputted from the reference terminal to said emitter follower unit is extracted or not, depending on the control voltage.

4. The power amplifier according to claim 3, wherein said mode switching unit further includes a field effect transistor having an input terminal connected to the control terminal, and an output terminal connected to the input terminal of said switch.

5. The power amplifier according to claim 4, wherein said mode switching unit further includes a Schottky barrier diode connected between the output terminal of said field effect transistor and the input terminal of said switch.

6. The power amplifier according to claim 4, wherein said mode switching unit further includes a resistor connected between the output terminal of said field effect transistor and a grounding point.

7. The power amplifier according to claim 1, wherein said mode switching unit further includes a switch for switching whether a collector voltage is applied or not to said emitter follower unit, depending on the control voltage.

8. The power amplifier according to claim 1, wherein said mode switching unit further includes:
a first resistor connected between the output terminal of said emitter follower unit and the input terminal of said amplifier element,
a plurality of second resistors, each second resistor being connected in parallel with said first resistor,
a plurality of control terminals to which the control voltage is individually applied, and
a plurality of switches for switching whether a corresponding second resistor is connected to said first resistor, corresponding to whether the control voltage applied or not to the corresponding control terminal.

9. The power amplifier according to claim 1, wherein said current injection unit includes:
a first resistor comprising a plurality of semiconductor layers, connected between the reference terminal and the input terminal of said amplifier element, and
a second resistor comprising a thin metal film, directly connected to said first resistor.

10. The power amplifier according to claim 1, wherein said current injection unit includes:
a first resistor connected between the reference terminal and the input terminal of said amplifier element,
a diode having an anode connected to the reference terminal and a cathode that is grounded, and
a second resistance connected in series to said diode.

11. The power amplifier according to claim 1 further comprising a shutdown circuit for shutting down said amplifier element depending on the control voltage.

* * * * *